(12) United States Patent
Yamamoto

(10) Patent No.: US 7,365,804 B2
(45) Date of Patent: Apr. 29, 2008

(54) TELEVISION TUNER FOR BALANCE-INPUTTING SIGNAL TO BALANCED MIXER

(75) Inventor: Masaki Yamamoto, Fukushima-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 605 days.

(21) Appl. No.: 11/061,049

(22) Filed: Feb. 17, 2005

(65) Prior Publication Data
US 2005/0190305 A1    Sep. 1, 2005

(30) Foreign Application Priority Data
Feb. 26, 2004   (JP) .............. 2004-000868

(51) Int. Cl.
*H04N 5/50*   (2006.01)
(52) U.S. Cl. .................................... 348/731
(58) Field of Classification Search ........ 348/731–733, 348/725; 455/180.1, 189.1, 191.1, 193.2
See application file for complete search history.

(56) References Cited

U.S. PATENT DOCUMENTS

| | | | | |
|---|---|---|---|---|
| 3,828,257 A | * | 8/1974 | Puskas | 455/180.4 |
| 4,590,616 A | * | 5/1986 | van Glabbeek | 455/319 |
| 4,619,001 A | * | 10/1986 | Kane | 455/192.3 |
| 4,921,465 A | * | 5/1990 | Hietala et al. | 455/193.3 |
| 6,011,966 A | * | 1/2000 | Ono et al. | 455/325 |

FOREIGN PATENT DOCUMENTS

| | | |
|---|---|---|
| JP | 7-7452 | 1/1995 |
| JP | 3096169 | 6/2003 |

\* cited by examiner

*Primary Examiner*—Paulos M. Natnael
(74) *Attorney, Agent, or Firm*—Brinks Hofer Gilson & Lione

(57) ABSTRACT

A television tuner includes an unbalanced tuning circuit and a balanced mixer provided at the next stage of the tuning circuit. An output port of the tuning circuit is grounded through a serial circuit composed of an inductive element and a capacitive means. The output port of the tuning circuit is connected to one input port of the mixer. A connection point provided between the inductive element and the capacitive means is connected to the other input port of the mixer. This permits phases of the signals input to two input ports of the mixer to be inverted to each other.

9 Claims, 2 Drawing Sheets

TELEVISION TUNER FOR BALANCE-INPUTTING SIGNAL TO BALANCED MIXER

This application claims the benefit of priority to Japanese Patent Application No. 2004-000868 filed on Feb. 26, 2004, herein incorporated by reference.

BACKGROUND OF THE INVENTION

1. Field of the Invention

The present invention relates to a television tuner and, more particularly, to a television tuner for balance-inputting a television signal to a balanced mixer.

2. Description of the Related Art

FIG. 5 shows a structure of a conventional television tuner. Balanced input ports 51 and 52 are connected to a tuning coil 53, and a serial circuit composed of a variable-capacitance diode 54 and a capacitor 55 is connected in parallel to the tuning coil 53. Further, a tuning DC-voltage input port 56 for controlling the capacitance of the variable-capacitance diode 54 is connected to a connection point between the variable-capacitance diode 54 and the capacitor 55 through a resistor 57. The above-mentioned structure is a primary side structure.

As a secondary side structure, a tuning coil 61 is connected to a double balanced mixer 20 through capacitors 62 and 63. In addition, a serial circuit composed of a variable-capacitance diode 64 and a capacitor 65 is connected in parallel to the coil 61. Also, a tuning DC-voltage input port 66 for controlling the capacitance of the variable-capacitance diode 64 is connected to the connection point between the variable-capacitance diode 64 and the capacitor 65 through a resistor 67. Further, one end of a resistor 68 is connected between the variable-capacitance diode 64 and the tuning coil 61 and the other end of the resistor 68 is grounded.

In addition, a predetermined frequency signal output from a local oscillator 14 is mixed to the output of the tuning circuit to make a predetermined intermediate frequency signal, and the intermediate frequency signal is supplied to intermediate frequency output ports 21, 22 (For example, see Patent Document 1).

[Patent Document 1] Japanese Unexamined Patent Application Publication No. 07-007452 (FIG. 1)

In the above-mentioned structure, as a means for balance-inputting the television signal to the double balanced mixer, a balanced tuning circuit is provided. However, as the tuning circuit used in a television tuner, an unbalanced tuning circuit including a single tuning circuit and a tuning circuit having a simple structure and a stable characteristic is mainly used.

SUMMARY OF THE INVENTION

Accordingly, it is an object of the present invention to provide a novel television tuner for balance-inputting a television signal to a balanced mixer by using an unbalanced tuning circuit.

As a means for solving the above-mentioned problem, a television tuner comprises an unbalanced tuning circuit, and a balanced mixer provided at the next stage of the tuning circuit, wherein an output port of the tuning circuit is grounded through a serial circuit composed of an inductive element and a capacitive means having a variable capacitance value, the output port of the tuning circuit is connected to one input port of the mixer, and a connection point between the inductive element and the capacitive means is connected to the other input port of the mixer.

In addition, the inductive element is provided at the output port side of the tuning circuit, the capacitive means is provided at the ground side, and a serial resonance frequency of the inductive element and the capacitive means is lower than a frequency of a signal input to the mixer from the tuning circuit.

Moreover, the capacitive means is provided at the output port side of the tuning circuit, the inductive element is provided at the ground side, and a serial resonance frequency of the inductive element and the capacitive means is higher than a frequency of a signal input to the mixer from the tuning circuit.

Furthermore, a capacitance value of the capacitive means decreases as a tuning frequency of the tuning circuit increases.

Also, the tuning circuit includes a first varactor diode applied with a tuning voltage, for changing the tuning frequency, the capacitive means includes at least a second varactor diode, and the second varactor diode is applied with the tuning voltage.

In addition, the capacitive means includes a capacitance element serially connected to the second varactor diode.

In one embodiment, a television tuner comprises an unbalanced tuning circuit, and a balanced mixer provided at the next stage of the tuning circuit, wherein an output port of the tuning circuit is grounded through a serial circuit composed of an inductive element and a capacitive means having a variable capacitance value, the output port of the tuning circuit is connected to one input port of the mixer, and a connection point provided between the inductive element and the capacitive means is connected to the other input port of the mixer. Accordingly, a signal having a frequency higher or lower than the resonance frequency of the serial circuit can be balance-input to the mixer.

In addition, in a second embodiment, the inductive element is provided at the output port side of the tuning circuit, the capacitive means is provided at the ground side, and a serial resonance frequency of the inductive element and the capacitive means is lower than a frequency of a signal input to the mixer from the tuning circuit. Accordingly, a signal having a frequency higher than the resonance frequency of the serial circuit can be balance-input to the mixer.

Moreover, in a third embodiment, the capacitive means is provided at the output port side of the tuning circuit, the inductive element is provided at the ground side, and a serial resonance frequency of the inductive element and the capacitive means is higher than a frequency of a signal input to the mixer from the tuning circuit. Accordingly, a signal having a frequency lower than the resonance frequency of the serial circuit can be balance-input to the mixer.

Furthermore, in a fourth embodiment, a capacitance value of the capacitive means decreases as a tuning frequency of the tuning circuit increases. Accordingly, flatness of the frequency characteristic of the level of the signal input to the other input port of the mixer can be improved.

Also, in a fifth embodiment, the tuning circuit includes a first varactor diode applied with a tuning voltage, for changing the tuning frequency, the capacitive means includes at least a second varactor diode, and the second varactor diode is applied with the tuning voltage. Accordingly, it is possible that as the tuning frequency increases, the capacitance value of the capacitive means decreases.

In addition, in a sixth embodiment, the capacitive means includes a capacitance element serially connected to the second varactor diode. Accordingly, flatness of the frequency characteristic of the level of the signal input to the other input port of the mixer can be further improved.

DESCRIPTION OF THE PREFERRED EMBODIMENT

Figure 1:
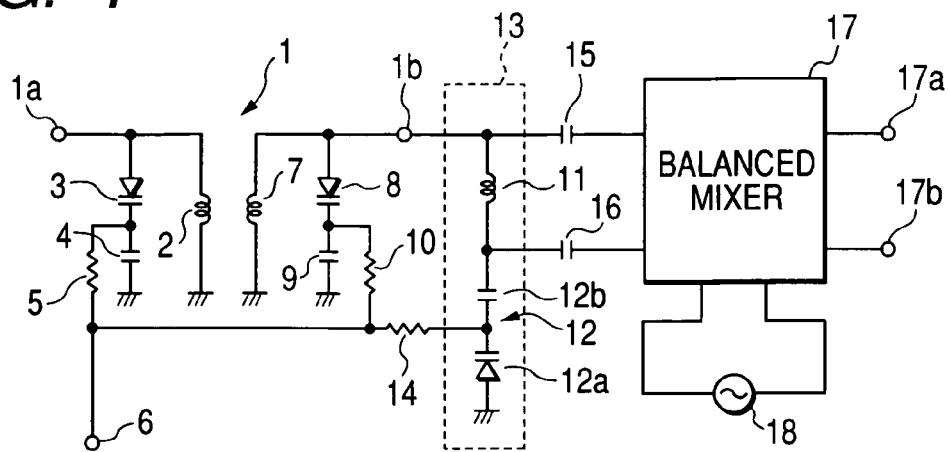
FIG. 1 is a circuit diagram showing a structure of a first embodiment of a television tuner of the present invention.

FIG. 1 shows a structure according to a first embodiment of the present invention. At a primary side of a double tuning circuit 1, a tuning coil 2 connected between an input port 1a and a ground, and a serial circuit which is composed of a first varactor diode 3 and a DC cut capacitor 4 and which is connected in parallel to the tuning coil 2 are provided. The anode of the first varactor diode 3 is connected to the input port 1a and the cathode thereof is connected to a tuning voltage port 6 through a resistor 5. The tuning voltage port 6 is applied with a tuning voltage for controlling the capacitance value of the first varactor diode 3.

At the secondary side, a tuning coil 7 connected between an output port 1b and the ground, and a serial circuit which is composed of a first varactor diode 8 and a DC cut capacitor 9 and which is connected to the tuning coil 7 are provided. The anode of the first varactor diode 8 is connected to an output port 1b and the cathode thereof is connected to the tuning voltage port 6 through a resistor 10.

A serial circuit 13 composed of an inductive element 11 and a capacitive means 12 is connected between the output port 1b of a double tuning circuit 1 and the ground. The capacitive means 12 is composed of a serial circuit including a capacitance element 12b and a second varactor diode 12a. Further, one end of the inductive element 11 is connected to the output port 1b and the anode of the second varactor diode 12a is grounded. The capacitance element 12b is interposed between the cathode of the second varactor diode 12a and the other end of the inductive element 11. The cathode of the second varactor diode 12a is applied with a tuning voltage through a resistor 14.

In addition, the output port of the double tuning circuit 1 is connected to one input port of a balanced mixer (such as a double balanced mixer) 17 through a coupling capacitor 15, and the connection point provided between the inductive element 11 and the capacitive means 12 is connected to the other input port of the balanced mixer 17 through a coupling capacitor 16. Also, a local oscillating signal from an oscillator 18 is balance-input to the balanced mixer 17. Thereby, an intermediate frequency signal is output from the balanced mixer 17 and is supplied to the output ports 17a, 17b.

In the above-mentioned structure, if the voltage value of the television signal output to the output port 1b of the double tuning circuit 1 is e, the inductance value of the inductive element 11 is L, and the capacitance value of the capacitive means 12 is C, the voltage value e' at the connection point provided between the inductive element 11 and the capacitive means 12 is expressed by equation (1).

$$e' = -e/(\omega^2 LC - 1) \qquad (1)$$

As can be seen from this equation, when $\omega^2 LC > 1$, the phase of the voltage e' is inverted with respect to that of the voltage e. That is, in a frequency higher than the serial resonance frequency (angle frequency is $\omega_0$) of the inductive element 11 and the capacitive means 12, the phase of the voltage e' is inverted with respect to that of the voltage e.

Accordingly, if the serial resonance frequency of the inductive element 11 and the capacitive means 12 is lower than the frequency of the television signal, the television signal can be balance-input to the balanced mixer by using the unbalanced double tuning circuit 1.

Figure 4:
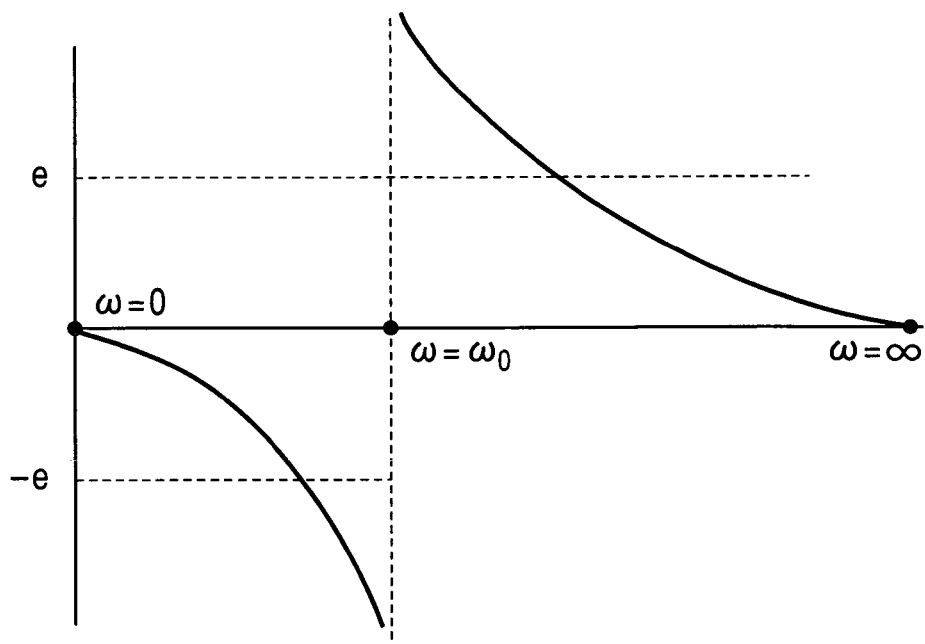
FIG. 4 is a frequency characteristic diagram of the input voltage of a mixer in the second embodiment related to the television tuner of the present invention.
Figure 5:
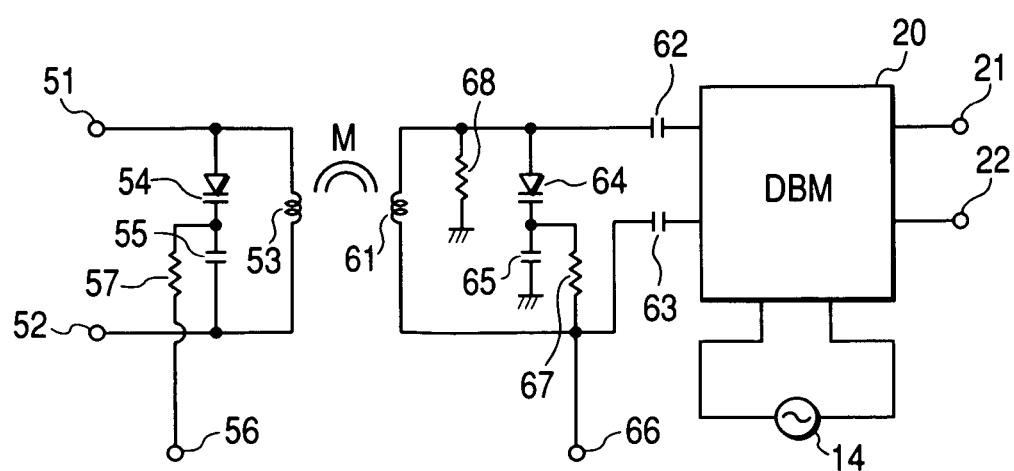
FIG. 5 is a circuit diagram showing a structure of a conventional television tuner.

Further, this voltage has a frequency characteristic shown in FIG. 4 and, in a frequency range higher than the serial resonance frequency $\omega_0$, the absolute value thereof decreases as the frequency increases. Accordingly, as can be seen from equation (1), if the capacitance value of the capacitive means 12 decreases as the frequency increases, the reduction of the voltage value e' is suppressed and thus the flatness of the television signal input to the balanced mixer can be improved.

Accordingly, as shown in FIG. 1, if the tuning voltage is applied to the second varactor diode 12a, the capacitance value of the capacitive means 12 decreases as the frequency increases, thereby accomplishing the above-mentioned object.

Figure 2:
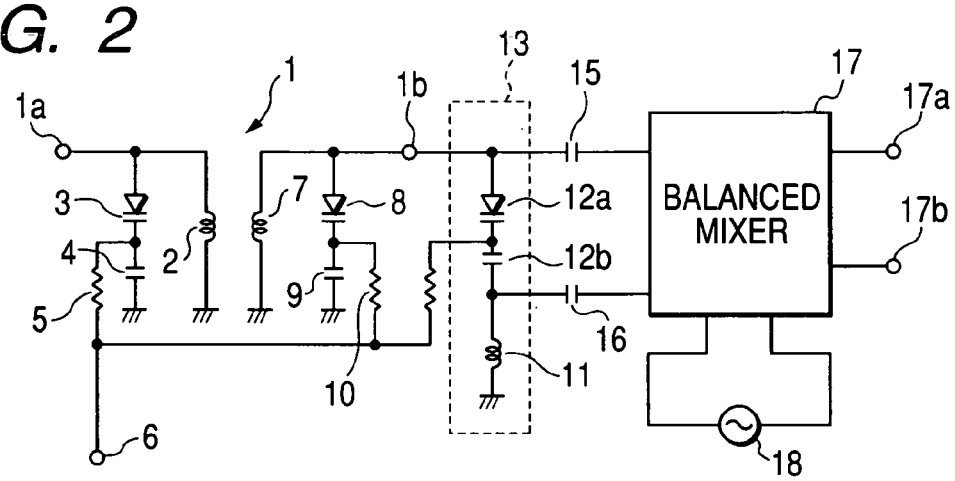
FIG. 2 is a circuit diagram showing a structure of a second embodiment of a television tuner of the present invention.
Figure 3:
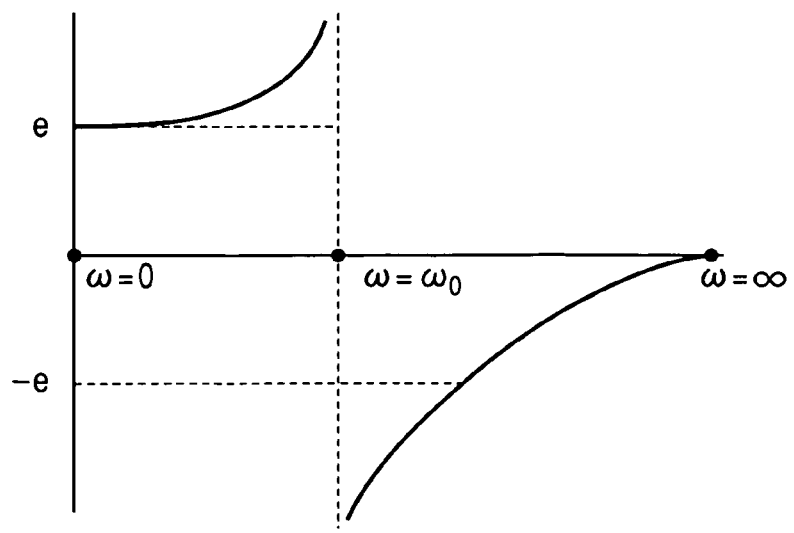
FIG. 3 is a frequency characteristic diagram of the input voltage of a mixer in the first embodiment related to the television tuner of the present invention.

FIG. 2 shows the structure according to a second embodiment of the present invention. In FIG. 2, the structure of the serial circuit 13 is different from that in FIG. 1 in that a connection location between the inductive element 11 and the capacitive means 12 are swapped. The other structure thereof is similar to that in FIG. 1. In other words, the anode of the first varactor diode 12a is connected to the output port 1b of the double tuning circuit 1. Also, one end of the inductive element 11 is grounded and the capacitance element 12b is connected between the cathode of the second varactor diode 12a and the other end of the inductive element 11.

In the structure of FIG. 2, if the voltage value of the television signal output to the output port 1b of the double tuning circuit 1 is e, the inductance value of the inductive element 11 is L, and the capacitance value of the capacitive means 12 is C, the voltage value e' at the connection point provided between the inductive element 11 and the capacitive means 12 is expressed by equation (2).

$$e' = -e\omega^2 LC/(1 - \omega^2 LC) \qquad (2)$$

As can be seen from this equation, when $1 > \omega^2 LC$, the phase of the voltage e' is inverted with respect to that of the voltage e. That is, at a frequency lower than the serial resonance frequency (angle frequency is $\omega_0$) of the inductive element 11 and the capacitive means 12, the phase of the voltage e' is inverted with respect to that of the voltage e.

Accordingly, if the serial resonance frequency of the inductive element 11 and the capacitive means 12 is higher than the frequency of the television signal, the television signal can be balance-input to the balanced mixer by using the unbalanced double tuning circuit 1.

If equation (2) is transformed, equation (3) is obtained.

$$e' = -e/((1/\omega^2 LC) - 1) \qquad (3)$$

Accordingly, this voltage has a frequency characteristic shown in FIG. 4 and, in a frequency range lower than the serial resonance frequency $\omega_0$, the absolute value thereof increases as the frequency increases.

Accordingly, as can be seen from equation (3), if the capacitance value of the capacitive means 12 decreases as the frequency increases, the reduction of the voltage value e' is suppressed and thus the flatness of the television signal input to the balanced mixer can be improved.

In addition, the capacitance element 12b in the capacitive means 12, which is serially connected to the second varactor diode 12a, corrects the frequency characteristic of the entire capacitance value of the capacitive means 12, thereby the frequency characteristic of the voltage e' can be as flat as it can be.

What is claimed is:

1. A television tuner comprising:
    an unbalanced tuning circuit; and
    a balanced mixer provided at a next stage of the tuning circuit,
    wherein an output port of the tuning circuit is grounded through a serial circuit composed of an inductive element and a capacitive means having a variable capacitance value, the output port of the tuning circuit is connected to one input port of the mixer, and a connection point provided between the inductive element and the capacitive means is connected to another input port of the mixer.

2. The television tuner according to claim 1,
    wherein the inductive element is provided at an output port side of the tuning circuit, the capacitive means is provided at a ground side, and a serial resonance frequency of the inductive element and the capacitive means is lower than a frequency of a signal input to the mixer from the tuning circuit.

3. The television tuner according to claim 1,
    wherein the capacitive means is provided at an output port side of the tuning circuit, the inductive element is provided at a the ground side, and a serial resonance frequency of the inductive element and the capacitive means is higher than a frequency of a signal input to the mixer from the tuning circuit.

4. The television tuner according to claim 2,
    wherein a capacitance value of the capacitive means decreases as a tuning frequency of the tuning circuit increases.

5. The television tuner according to claim 4,
    wherein the tuning circuit includes a first varactor diode applied with a tuning voltage for changing the tuning frequency, the capacitive means includes at least a second varactor diode, and the second varactor diode is applied with the tuning voltage.

6. The television tuner according to claim 5,
    wherein the capacitive means includes a capacitance element serially connected to the second varactor diode.

7. The television tuner according to claim 3,
    wherein a capacitance value of the capacitive means decreases as the tuning frequency of the tuning circuit increases.

8. The television tuner according to claim 7,
    wherein the tuning circuit includes a first varactor diode applied with a tuning voltage, for changing the tuning frequency, the capacitive means includes at least a second varactor diode, and the second varactor diode is applied with the tuning voltage.

9. The television tuner according to claim 8,
    wherein the capacitive means includes a capacitance element serially connected to the second varactor diode.

* * * * *

UNITED STATES PATENT AND TRADEMARK OFFICE
CERTIFICATE OF CORRECTION

PATENT NO. : 7,365,804 B2 Page 1 of 1
APPLICATION NO. : 11/061049
DATED : April 29, 2008
INVENTOR(S) : Masaki Yamamoto It is certified that error appears in the above-identified patent and that said Letters Patent is hereby corrected as shown below:

Columns 5-6, in claim 3, line 4, after "provided at a" delete "the".

Signed and Sealed this

Nineteenth Day of August, 2008

JON W. DUDAS
*Director of the United States Patent and Trademark Office*

UNITED STATES PATENT AND TRADEMARK OFFICE
CERTIFICATE OF CORRECTION

```
PATENT NO.        : 7,365,804 B2                                        Page 1 of 1
APPLICATION NO.   : 11/061049
DATED             : April 29, 2008
INVENTOR(S)       : Masaki Yamamoto
```

It is certified that error appears in the above-identified patent and that said Letters Patent is hereby corrected as shown below:

Columns 6, in claim 3, line 1, after "provided at a" delete "the".

This certificate supersedes the Certificate of Correction issued August 19, 2008.

Signed and Sealed this

Sixteenth Day of September, 2008

JON W. DUDAS
*Director of the United States Patent and Trademark Office*